US008244194B2

(12) United States Patent
Morgan et al.

(10) Patent No.: US 8,244,194 B2
(45) Date of Patent: Aug. 14, 2012

(54) NARROW-BAND TUNABLE RADIO FREQUENCY (RF) POWER AMPLIFIERS AND RELATED METHODS

(75) Inventors: Patrick N. Morgan, Austin, TX (US); Timothy J. Dupuis, West Lake Hills, TX (US); David E. Bockelman, Dripping Springs, TX (US)

(73) Assignee: Javelin Semiconductor, Inc., Austin, TX (US)

( * ) Notice: Subject to any disclaimer, the term of this patent is extended or adjusted under 35 U.S.C. 154(b) by 277 days.

(21) Appl. No.: 12/803,884

(22) Filed: Jul. 8, 2010

(65) Prior Publication Data

US 2012/0009889 A1    Jan. 12, 2012

(51) Int. Cl.
*H04B 1/18* (2006.01)
(52) U.S. Cl. .................................. 455/188.1; 455/180.1
(58) Field of Classification Search ............... 455/188.1, 455/150.1, 180.1, 194.2, 552.1, 333; 330/151, 330/136
See application file for complete search history.

(56) References Cited

U.S. PATENT DOCUMENTS

| | | | |
|---|---|---|---|
| 6,212,367 B1 | 4/2001 | Tolson | 455/114 |
| 6,232,841 B1 | 5/2001 | Bartlett et al. | 330/305 |
| 6,597,244 B2 | 7/2003 | Tichauer | 330/298 |
| 6,859,101 B1 * | 2/2005 | Leffel | 330/280 |
| 6,876,698 B1 * | 4/2005 | Dick et al. | 375/229 |
| 7,057,799 B2 * | 6/2006 | Chu | 359/308 |
| 7,202,734 B1 | 4/2007 | Raab | 330/126 |
| 7,567,129 B2 | 7/2009 | Rohani et al. | 330/305 |
| 7,764,125 B2 | 7/2010 | Dawe | 330/305 |
| 7,773,707 B2 * | 8/2010 | Einbinder | 375/350 |
| 7,808,312 B2 * | 10/2010 | Ichitsubo et al. | 330/129 |
| 7,911,277 B2 | 3/2011 | Paul et al. | 330/305 |
| 8,144,064 B2 * | 3/2012 | Milosevic | 343/723 |
| 2004/0224649 A1 | 11/2004 | Shamsaifar | 455/107 |
| 2009/0273397 A1 | 11/2009 | Bockelman et al. | 330/51 |
| 2009/0278609 A1 | 11/2009 | Srinivasan et al. | 330/297 |
| 2011/0065472 A1 | 3/2011 | Zhu et al. | 455/552.1 |

OTHER PUBLICATIONS

Abhishek Jajoo., et al., "*MEMS Varactor Enabled Frequency-Reconfigurable LNA and PA in the Upper UHF Band*," IEEE MTT-S, 7-12, pp. 1121-1124 (Jun. 2009).
W. C. Edmund Neo , et al., "*Adaptive Multi-Band Multi-Mode Power Amplifier Using Integrated Varactor-Based Tunable Matching Networks*," IEEE Journal of Solid-State Circuits, vol. 41, No. 9, pp. 2166-2176 (Sep. 2006).

(Continued)

*Primary Examiner* — Sonny Trinh
(74) *Attorney, Agent, or Firm* — O'Keefe, Egan, Peterman & Enders, LLP

(57) ABSTRACT

Narrow band tunable radio frequency (RF) power amplifiers (PAs) and related methods are disclosed that provide narrow band tunable gain responses, such as linear gain responses, that can be selected for different frequency bands. The narrow band tunable PAs thereby provide out-of-band rejection for different selectable frequency bands so that narrow band filters are not required in the transmit input path for communication devices. The pass band location and/or bandwidth for the narrow band gain response can be tuned using different techniques, as desired. The narrow band tunable PAs can also be fabricated using CMOS processing, if desired, so that a CMOS PA integrated circuit is provided.

24 Claims, 7 Drawing Sheets

OTHER PUBLICATIONS

Dongjiang Qiao, et al., "*An Intelligently Controlled RF Power Amplifier With a Reconfigurable MEMS-Varactor Tuner*," IEEE Transactions on Microwave Theory and Techniques, vol. 53, No. 3, pp. 1089-1095 (Mar. 2005).

Haitao Zhang, et al., "*A Novel Tunable Broadband Power Amplifier Module Operating from 0.8GHz to 2.0 GHz*," IEEE MTT-S, pp. 661-664 (Jun. 12-17, 2005).

International Patent Application No. PCT/US2011/001122, "*International Search Report*" and "*Written Opinion*," International filing date (Jun. 23, 2011).

U.S. Appl. No. 12/657,996, "*CMOS Power Amplifiers Having Integrated One-Time Programmable (OTP) Memories*," filed on Feb. 1, 2010.

\* cited by examiner

NARROW-BAND TUNABLE RADIO FREQUENCY (RF) POWER AMPLIFIERS AND RELATED METHODS

TECHNICAL FIELD OF THE INVENTION

This invention relates to radio frequency (RF) power amplifiers and, more particularly, to frequency band selection for communication devices using RF power amplifiers.

BACKGROUND

Radio frequency (RF) power amplifiers (PAs) are used to produce output transmit signals by amplifying weak input signals in wireless devices, such as cellular telephone handsets. Many of these communication devices are configured to operate in different frequency bands for different communication systems. For example, current third generation (3G) cellular communication systems utilize a variety of different frequency bands above 1 GHz, such as, for example, 1920-1980 Mhz for WCDMA. Prior second generation (2G) cellular communication systems also utilize a variety of different frequency bands, such as, for example, 824-849 Mhz for GSM 800, 880-915 Mhz for GSME 900, 1710-1785 Mhz for DCS 1800, and 1850-1910 Mhz for PCS 1900.

To operate in multiple frequency bands and thereby multiple communication systems, cellular handset applications typically use wideband power amplifiers to amplify and output transmit signals. These cellular wideband power amplifiers exhibit high gain across a wide frequency range, enabling them to amplify multiple frequency bands. However, transmit signal gain and noise in certain frequency bands is detrimental to system performance, for example, in the cellular receive band or in the bands used for other communication systems, such as those used by Bluetooth transceivers and/or GPS (global positioning system) receivers. In cellular handset applications, the wideband power amplifiers are typically followed by duplexers that pass the desired range of frequencies for the selected frequency band and reject signals in frequencies outside the selected frequency band. A tunable narrow-band filter on the input signal to the power amplifier may also be used to minimize the unwanted noise contributions outside the selected frequency band.

FIG. 1A (Prior Art) is a diagram of an example gain response 102 for a wideband power amplifier (PA). The wideband gain response 102 provides high gain for a wide range of frequencies between a lower frequency corner ($f_L$) and a higher frequency corner ($f_H$). As depicted, this wide range of frequencies 108 includes two communication frequency bands (B1, B2). The first communication frequency band (B1) includes a range of frequencies 104 between a first low frequency ($f_{L1}$) and a first high frequency ($f_{H1}$). The second communication frequency band (B2) includes a range of frequencies 106 between a second low frequency ($f_{L2}$) and a second high frequency ($f_{H2}$). Because the wideband PA provides high gain across both frequency bands, frequencies within the non-selected band can be amplified in the PA output signal in addition to frequencies within the desired frequency band. For example, if the second band (B2) is used for transmission by the communication device, undesired transmit signals or noise that have frequencies within the first band (B1) will still be amplified and output by the wideband PA.

FIG. 1B (Prior Art) is a block diagram of an embodiment 150 for output circuitry used by a communication device including a wideband PA 152. As depicted, the wideband PA 152 receives a transmit signal (TX) 168 that has been passed through a tunable narrow band filter 166. This transmit signal (TX) 168 can be provided, for example, from a baseband (BB) processor and/or a transceiver (XCVR) 160 in a communication device. The wideband PA 152 depicted is configured to be used for two possible frequency bands of operation (B1, B2). The amplified output of the wideband PA 152 is provided to a switch (SW) 154. The switch (SW) 154 is controlled by a band select signal 170, which can also be provided by the BB processor and/or transceiver (XCVR) 160. Based upon the band select signal 170, the switch (SW) 154 sends the amplified output signal to a first duplexer 156 for the first band (B1) or to a second duplexer 158 for the second band (B2). As depicted, the first duplexer (B1) 156 is configured to pass frequencies within the first frequency band (B1) and reject other frequencies. Similarly, the second duplexer (B2) 158 is configured to pass frequencies within the second frequency band (B2) and reject other frequencies. The output transmit signals from the duplexers 156 and 158 are then provided to the antenna switch module (ASM) 162. The duplexers 156 and 158 are used for transmit and receive operations in a bi-directional communication device. In receive mode, duplexer 156 outputs a first receive signal (RX1) 157 that can be provided to the baseband processor or transceiver 160. Similarly, in receive mode, duplexer 158 outputs a second receive signal (RX2) 157 that can be provided to the baseband processor or transceiver 160. The ASM 162 can also be configured to receive the band select signal 170, and the band select signal 170 can be used by the ASM 162 to couple the proper duplexer to the antenna 164. The tunable narrow band filter 166 can also be configured to receive the band select signal 170, and the band select signal 170 can be used to tune the tunable narrow band filter 166 for a selected band.

It is noted that in addition to the first band (B1) and the second band (B2), the communication device can be configured for operation in additional frequency bands that utilize different transmit and/or receive circuitry than that depicted in FIG. 1B (Prior Art). For example, the communication device could be configured to have a global position system (GPS) receiver and/or a Bluetooth transceiver, if desired, that also utilize the same antenna 164.

One disadvantage of the output circuitry 150 of FIG. 1B (Prior Art) is the need for a tunable narrow band filter at the input to the wideband PA 152 to reduce energy in non-selected frequency bands. Regulations associated with many communication systems restrict the amount of out-of-band energy that can be transmitted by a communication device operating with the communication system. For example, transmitted energy within a non-selected first band (B1) may need to be significantly less than transmitted energy within a selected second band (B2). Thus, as depicted in FIG. 1B, the narrow band filter at the input to the PA is used to provide the necessary out-of-band rejection needed to satisfy the regulatory requirements. Even if regulatory requirements are satisfied, the additional rejection is needed to improve the ability of the system to detect very weak receiver signals in the non-selected frequency bands, such as GPS or Bluetooth. The narrow band filter, however, raises the cost and size requirements for communication devices configured to operate in multiple frequency bands.

SUMMARY OF THE INVENTION

Narrow band tunable radio frequency (RF) power amplifiers (PAs) and related methods are disclosed that provide narrow band tunable gain responses, such as linear gain responses, that can be selected for different frequency bands.

The narrow band tunable RF PAs thereby provide out-of-band rejection for different selectable frequency bands so that narrow band filters are not required in the transmit input path for communication devices. The passband location and/or bandwidth for the narrow band gain response can be tuned using different techniques, as desired. In one embodiment, the narrow band tunable RF PA has a plurality of predetermined frequency responses that can be selected for a plurality of different frequency bands. Still further, a band select signal typically applied to an antenna switch module (ASM) can also be provided to the narrow band tunable RF PA to select the frequency response to be used. Where the narrow band tunable RF PA is implemented within an integrated circuit, one or more output pins for the RF PA integrated circuit can be used for receiving one or more control signals, such as the band selection signal for the ASM, to select the desired operation band and frequency response for the RF PA integrated circuit. Further, these external control signals and/or internal control signals can be used to provide programmable tuning control for the narrow band tunable RF PA. The integrated circuit can also be fabricated using CMOS processing, if desired, so that a CMOS PA integrated circuit is provided. If desired, other features and variations can be implemented, and related systems and methods can be utilized, as well.

In one embodiment, a narrow band tunable RF power amplifier includes amplifier circuitry configured to receive a radio frequency (RF) signal and to generate an amplified RF output signal where the amplifier circuitry is configured to provide a narrow band gain response tunable across a plurality of different frequency bands based upon one or more tuning control signals and where the narrow band gain response being linear across the different frequency bands. The narrow band RF power amplifier also includes control circuitry configured to provide the one or more tuning control signals to the amplifier circuitry based upon a frequency band selection signal. Further, each of the plurality of different frequency bands are associated with a different communication system. The narrow band gain response is configured to pass frequencies within a selected frequency band and to reject frequencies outside the selected frequency band. And the amplifier circuitry and the control circuitry are integrated on the same integrated circuit. If desired, the integrated circuit can also be fabricated using CMOS processing so that a CMOS PA integrated circuit is provided.

In further embodiments, the narrow band tunable RF power amplifier includes one or more amplifier stages and one or more tunable resonant structures associated with the one or more amplifier stages where each tunable resonant structure is configured to receive the one or more tuning control signals to adjust the narrow band gain response for the amplifier circuitry. Further, a center frequency and/or a bandwidth for the narrow band gain response is adjustable. Still further, the narrow band tunable RF power amplifier can include a transmit input pin coupled to the amplifier circuitry and configured to receive the RF signal; a transmit output pin coupled to the amplifier circuitry and configured to output the amplified RF signal; and at least one band selection input pin coupled to the control circuitry and configured to receive a band selection signal. In addition, the band selection signal can be a signal configured to be provided to an antenna switch module for a communication device. Still further, the narrow band tunable RF power amplifier can include a transmit input pin coupled to the amplifier circuitry and configured to receive the RF signal; a transmit output pin coupled to the amplifier circuitry and configured to output the amplified RF signal; and at least one control input pin coupled to the control circuitry and configured to receive control signals, the control signals being configured to provide band selection. Still further, one or more internal control signals can be coupled to the control circuitry to adjust the narrow band gain response.

In another embodiment, a method for operating a narrow band tunable RF power amplifier includes selecting a frequency band of operation for a narrow band tunable RF power amplifier from a plurality of different frequency bands where each of the plurality of different frequency bands being associated with a different communication system, tuning the narrow band tunable RF power amplifier to have a narrow band gain response for the selected frequency band where the narrow band gain response being configured to pass frequencies within a selected frequency band and to reject frequencies outside the selected frequency band, receiving a radio frequency (RF) signal, amplifying the RF input signal using the tuned narrow band gain response, the narrow band gain response being linear across the selected frequency band, and outputting the amplified RF signal, where the selecting, tuning, receiving, amplifying and outputting steps are performed within a single integrated circuit. If desired, the integrated circuit can also be fabricated using CMOS processing so that the selecting, tuning, receiving, amplifying and outputting steps are performed on a single CMOS PA integrated circuit.

In further embodiments, the tuning step can include tuning one or more resonant structures associated with one or more amplifier stages to adjust the narrow band gain response. The tuning step can also include tuning a center frequency for the narrow band gain response and/or tuning a bandwidth for the narrow band gain response. Still further, the receiving step can include receiving the RF signal through a transmit input pin; the outputting step can include outputting the amplified RF signal through a transmit output pin; and the selecting step can include using a band selection signal received through at least one band selection input pin. In addition, the band selection signal can include a signal configured to be provided to an antenna switch module for a communication device. Still further the receiving step can include receiving the RF signal through a transmit input pin; the outputting step can include outputting the amplified RF signal through a transmit output pin; and the selecting step can include using control signals received through at least one control input pin. Further, one or more internal control signals can be used to adjust the narrow band gain response, if desired.

DESCRIPTION OF THE DRAWINGS

It is noted that the appended drawings illustrate only exemplary embodiments of the invention and are, therefore, not to be considered limiting of its scope, for the invention may admit to other equally effective embodiments.

DETAILED DESCRIPTION OF THE INVENTION

Narrow band tunable radio frequency (RF) power amplifiers (PAs) and related methods are disclosed that provide a tunable narrow band gain response that can be selected for different frequency bands and that can be linear across these different frequency bands. The narrow band tunable RF PAs thereby provide out-of-band rejection for different selectable frequency bands so that additional narrow band filters are not required in the transmit output path for communication devices. If desired, the integrated circuit can also be fabricated using CMOS processing so that a CMOS PA integrated circuit is provided.

It is noted that "narrow band" is used herein to refer to a gain response that has 3 dB corners at a high frequency and a low frequency that surround only a single frequency band. It is also noted that "frequency band" is used here to refer to a range of frequencies used by a communication system for transmit and/or receiver operations or to a range of frequencies used within a communication system for transmit operations as opposed to receive operations. For example, as described in the background above, current 2G and 3G cellular telephone communication systems use different dedicated frequency ranges depending upon government regulations for particular geographic regions. Further, within a particular communication system, a portion of the frequency range may be dedicated for transmit operations and a portion of the frequency range may be dedicated for receive operations. It is further noted that "linear" is used herein to refer to a power amplifier that provides an output signal that is generally proportional to its input signal across its frequency range of operation.

Figure 2A:
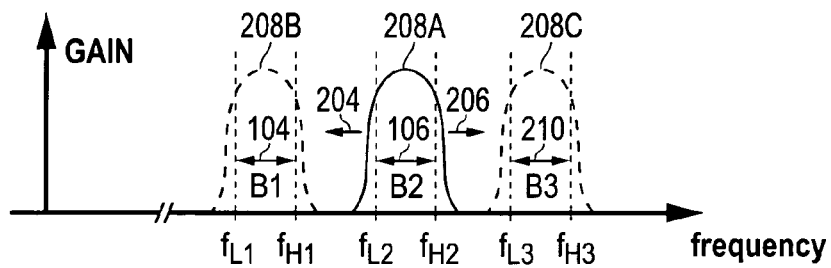
FIG. 2A is a diagram of an example tunable gain response for a narrow band tunable power amplifier (PA).
Figure 2B:
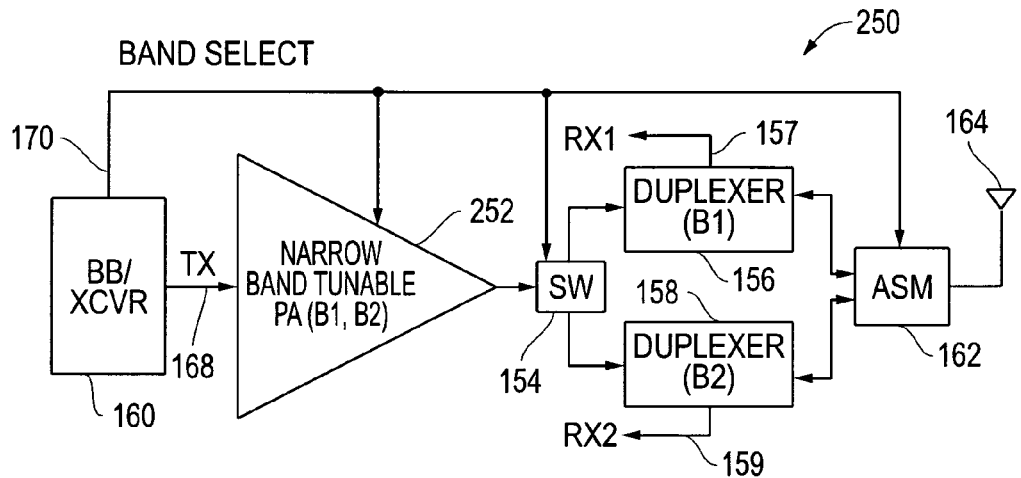
FIG. 2B is a block diagram of an embodiment for output circuitry used by a communication device including a narrow band tunable PA.
Figure 2C:
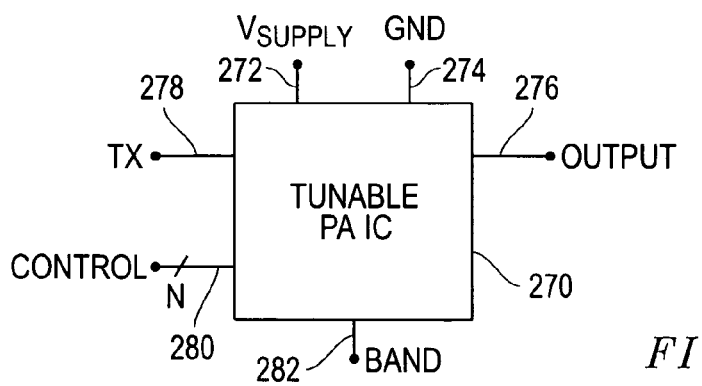
FIG. 2C is a block diagram of an embodiment for a narrow band tunable PA integrated circuit.
Figure 4A:
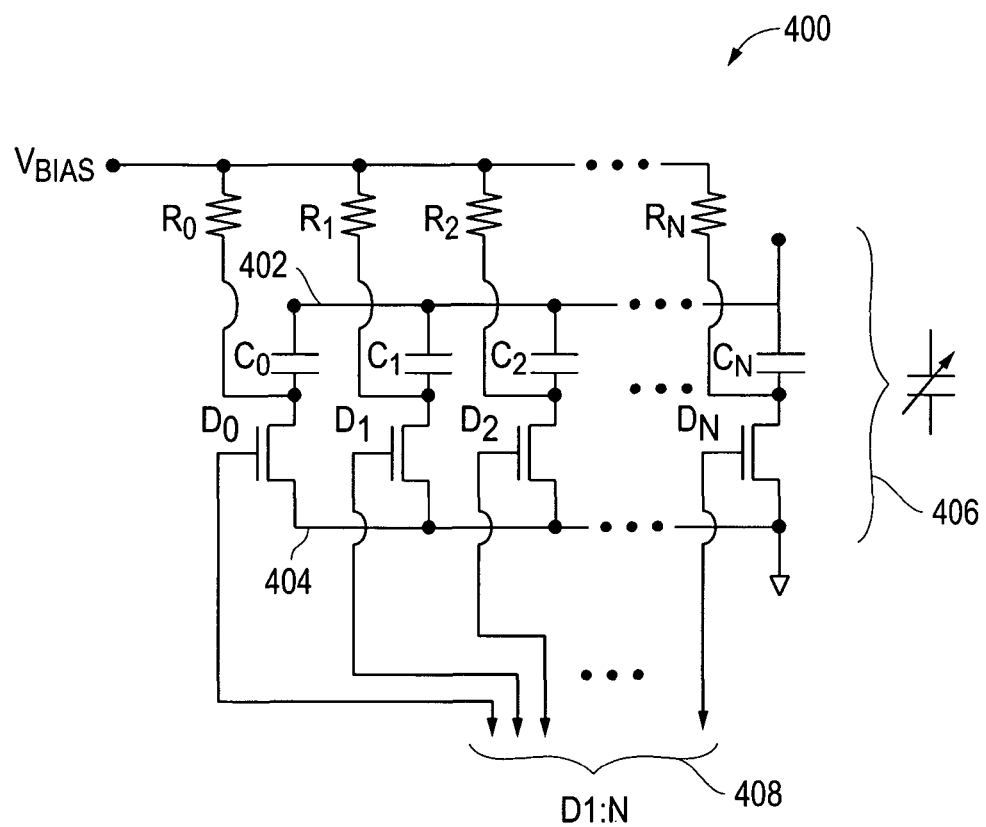
FIG. 4A is a circuit diagram of an embodiment for a variable capacitor implementation for lower voltage signals.
Figure 4B:
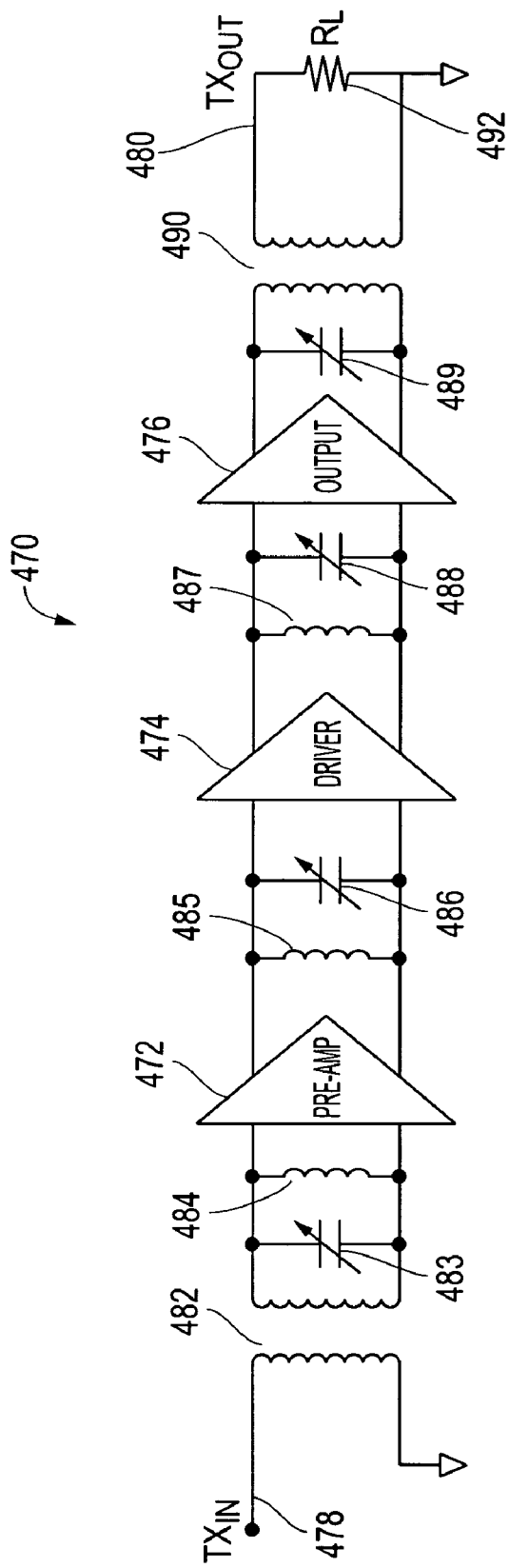
FIG. 4B is a circuit block diagram of an embodiment, for a narrow band tunable PA architecture including multiple gain stages and multiple variable capacitors.
Figure 5:
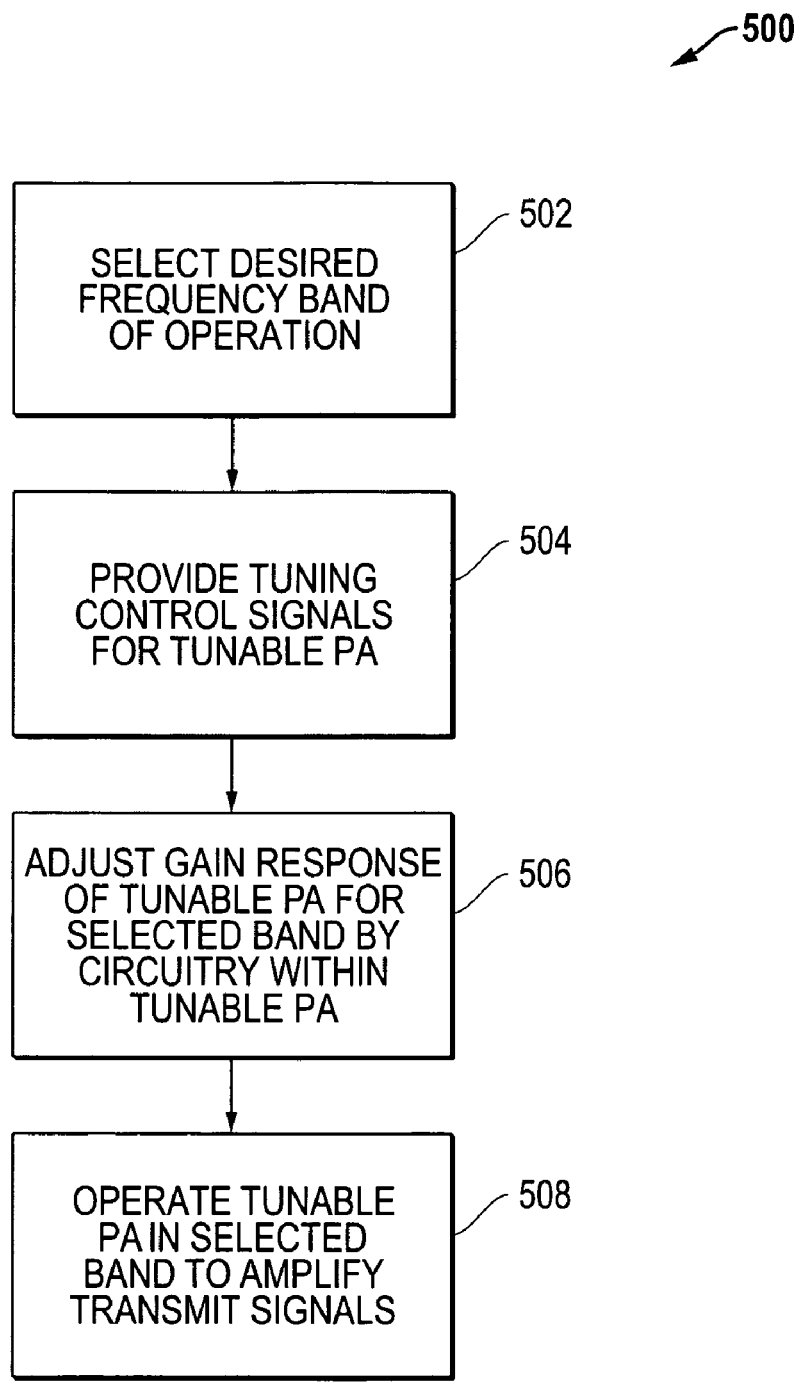
FIG. 5 is a flow diagram of an embodiment for a process flow for adjusting the gain response for a narrow band tunable PA as described herein.

Example embodiments will now be discussed for narrow band tunable PAs that have linear gain responses selectable across a plurality of frequency bands for different communication systems. FIGS. 2A-C provide an example embodiment for a narrow band tunable PA. FIGS. 3A-E provide example embodiments for tunable resonant circuitry and related control circuitry. FIGS. 4A-C provide example embodiments for tunable capacitor circuitry and related position in a multi-stage PA. And FIG. 5 provides an example process flow diagram. It is noted that the embodiments depicted are examples and should not be considered as limiting the invention. A wide variety of implementations could be used to provide a narrow band tunable PA providing a linear gain response across a plurality of frequency bands, as described herein.

Figure 1A:
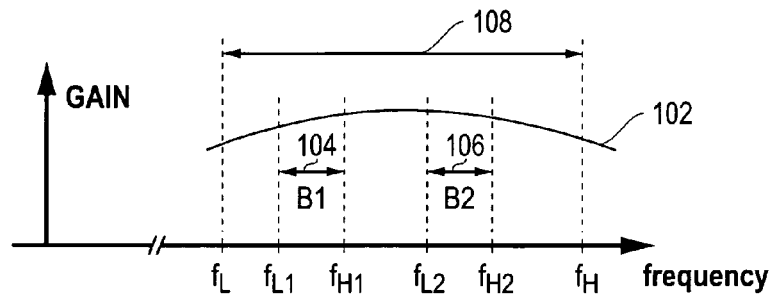
FIG. 1A (Prior Art) is a diagram of an example gain response for a wideband power amplifier (PA).

FIG. 2A is a diagram of an example tunable gain response for a narrow band tunable power amplifier (PA). Similar to FIG. 1A (Prior Art), two frequency bands are shown (B1, B2). In addition, a third frequency band (B3) 210 is shown. The first communication frequency band (B1) includes a range of frequencies 104 between a first low frequency ($f_{L1}$) and a first high frequency ($f_{H1}$). The second communication frequency band (B2) includes a range of frequencies 106 between a second low frequency ($f_{L2}$) and a second high frequency ($f_{H2}$). The third communication frequency band (B3) includes a range of frequencies 210 between a third low frequency ($f_{L3}$) and a third high frequency ($f_{H3}$). The narrow band frequency response for the tunable PA is shown as response 208A, and the response 208A is configured to have a high frequency corner and a low frequency corner that allow for frequencies within the second frequency band (B2) 106 to pass while rejecting frequencies outside that frequency band.

As represented by arrow 204, the center frequency of the response 208A can be adjusted down so that it is configured to pass frequencies within the first frequency band (B1) 104, as represented by dotted frequency response 208B. Similarly, as represented by arrow 206, the center frequency of the response 208A can be adjusted up so that it is configured to pass frequencies within the third frequency band (B3) 210, as represented by dotted frequency response 208C. It is also noted that in additional to adjusting the center frequency of the gain response 208A, the bandwidth of the frequency response 208A could also be adjusted, either symmetrically or asymmetrically, for different frequency bands, if desired. It is further noted that the gain response 208A can also be configured to have tunable bandwidth and/or center frequency within a desired frequency band of interests so that only a portion of frequencies within a frequency band are amplified by the gain response, such as where a portion of the frequency band is used for transmit operations and a portion of the frequency band is used for receive operations.

Figure 1B:
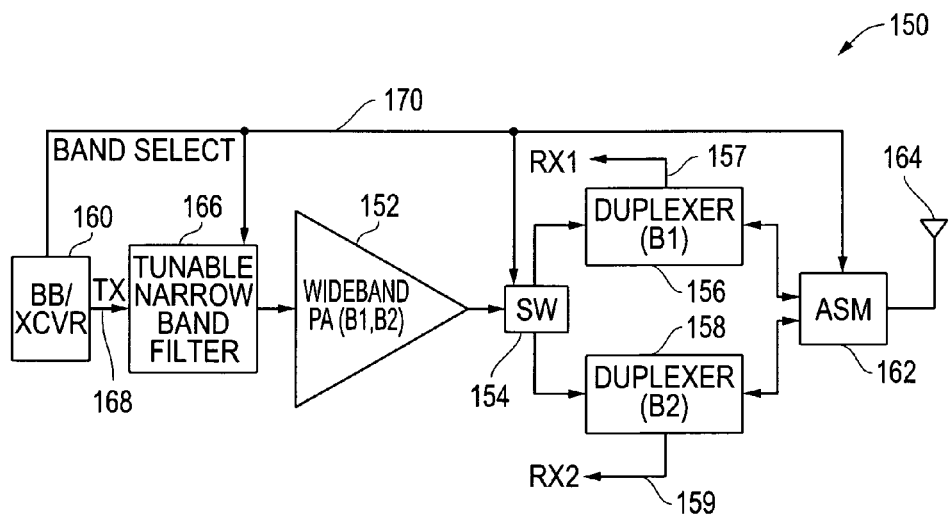
FIG. 1B (Prior Art) is a block diagram of an embodiment for output circuitry used by a communication device including a wideband PA.

FIG. 2B is a block diagram of an embodiment for output circuitry 250 used by a communication device including a narrow band tunable PA 252. As depicted, a baseband (BB) processor and/or transceiver (XCVR) 160 provides a transmit (TX) signal 168 to the narrow band tunable PA 252 which is configured to operate in two frequency bands (B1, B2). As in FIG. 1B (Prior Art), the output of the narrow band tunable PA 252 is provided to switch (SW) 154, which selectively sends the amplified transmit output signals to duplexer (B1) 156 for a first band or to duplexer (B2) 158 for a second band. As described above, the duplexers 156 and 158 can be configured to output receive signals (RX1, RX2) 157 and 159, respectively, for bi-directional communication systems, and these receive signals can be provided back to the baseband (BB) processor and/or transceiver (XCVR) 160. As described above, the BB processor and/or transceiver (XCVR) 160 can output a band selection signal 170 that is provide to the switch (SW) 154 and the ASM 162. This band selection signal 170 can also be provided to the narrow band tunable PA 252. Although separate control signals could be provided by the BB processor and/or transceiver (XCVR) 160 to the narrow band tunable PA 252, as described below, the use of the band select signal 170, which is already being supplied to the switch (SW) 154 and/or ASM 162, provides one efficient implementation for selecting the desired, tuning adjustments for the narrow band tunable PA 252.

It is noted that the narrow band tunable PA 252 is preferably a linear PA so that it provides an output signal that is generally proportional to its input signal across its frequency range of operation. It is further noted that for narrow band tunable PAs used in cellular telephone handset applications, the input RF frequencies for these narrow band tunable PAs are typically above 600 MHz and generally between about 800 to 2000 MHz.

FIG. 2C is a block diagram of an embodiment for a narrow band tunable PA integrated circuit (IC) 270. As indicated above, the integrated circuit can also be fabricated using CMOS processing, if desired, so that a CMOS PA integrated circuit is provided. However, other semiconductor processing could also be used, as desired. As depicted, the PA integrated circuit 270 includes a plurality of input/output pins. The transmit (TX) pin is configured to receive a transmit input signal, such as a transmit signal from a baseband processor and/or transceiver. A voltage supply ($V_{SUPPLY}$) is coupled to one or more pins 272 to provide a supply voltage for the integrated circuit 270. A ground (GND) level is coupled to one or more pins 274 to provide a ground connection for the integrated circuit 270. It is also noted that different voltage supplies and ground planes can be coupled to input pins of the PA integrated circuit 270, if desired. The output (OUTPUT) pin 276 is configured to provide the amplified output of the PA integrated circuit 270. One or more control input pins and/or control output pins can also be provided, such as the N-bit control (CONTROL) input pins 280 shown in FIG. 2C. For example, control signals provided to these CONTROL input pins 280 can be used to control the gain of the tunable PA 270 and/or to control the gain response for the tunable PA 270. Further, as indicated above, the PA integrated circuit 270 can also include a band select (BAND) input pin 282 that can receive a band selection signal, for example, from a baseband processor and/or transceiver. It is further noted that one or more of the input/output pins for the PA integrated circuit 270 can be multi-use pins and/or general purpose input/output pins that can be used for different purposes in different modes of operation for the PA integrated circuit 270.

It is noted that the passband location and/or bandwidth for the gain response of the narrow band tunable PAs can be selected using different techniques, as desired. For example, the narrow band tunable PA can be configured to have a plurality of predetermined gain response settings that can be selected for a plurality of different frequency bands. Further, as indicated above, a band select signal typically applied to an antenna switch module (ASM) can also be provided to the narrow band tunable PA to select the frequency response to be used. As also indicated above, where the narrow band tunable PA is implemented within an integrated circuit, one or more pins for the PA integrated circuit can be used for receiving one or more control signals, such as the band selection signal for the ASM, to select the desired operation band and frequency response for the PA integrated circuit. Further, the control signals provided through input pins can be used to provide programmable tuning control for the PA.

It is further noted that a variety of interfaces could be utilized to provide control signals for the tunable PA 270 to be used in adjusting its gain response across multiple frequency bands of operation. For example, a serial interface, such as a 2-pin or 3-pin serial interface, could be used to communicate control information to the tunable PA integrated circuit 270. Further, internal control signals could be used to control at least in part the tuning of the gain response, if desired. In addition, one or more input pins could also be configured to be used to program the tunable PA integrated circuit 270 so that a desired gain response is achieved by the PA integrated circuit 270 for a desired frequency band of operation. On-chip registers, look-up tables or other data storage circuitry could also be used to store information associated with the tuning of the gain response. This data storage circuitry can also be configured to contain fixed data or programmable data or both, as desired. In short, a wide range of control interfaces and techniques could be implemented to control the gain response for the tunable PA. One such control interface protocol that can be used is the MIPI standard protocol being developed by the RF Front-End Control (RFFE) Working Group for MIPI (Mobile Industry Processor Interface) Alliance.

CMOS PAs that can be configured as narrow band tunable CMOS PAs providing a linear gain response, as described herein, include CMOS PAs described in the following co-pending applications: U.S. patent application Ser. No. 12/151,199, entitled "CONTROLLING POWER WITH AN OUTPUT NETWORK" and filed May 5, 2008 (now published as U.S. Published Patent Application 2009-0273397), and U.S. patent application Ser. No. 12/151,812, entitled "SUPPLY CONTROL FOR MULTIPLE POWER MODES OF A POWER AMPLIFIER" and filed May 8, 2008 (now published as U.S. Published Patent Application 2009-0279609), each of which is hereby incorporated by reference in its entirety. CMOS PAs that can be programmed in part using integrated OTP (one-time programmable) memory to provide programmable tuning after fabrication are the following co-pending application: U.S. patent application Ser. No. 12/657,996, entitled "CMOS POWER AMPLIFIERS HAVING INTEGRATED ONE-TIME PROGRAMMABLE (OTP) MEMORIES" and filed Feb. 1, 2010, which is hereby incorporated by reference in its entirety. Further, Example embodiments for implementing narrow band tunable PAs are now discussed with respect to FIGS. 3A-E. These embodiments utilize tunable capacitors that resonate with inductors or transformers placed between gain stages within a narrow band tunable PA. The resonance creates a narrow band gain response, and the tunable capacitors allow the gain response to be shifted in frequency. It is noted that these embodiments are provided as examples and should not be considered as limiting the invention. A wide variety of tunable circuitry implementations could be utilized, as desired, to implement the narrow band tunable PAs described herein.

Figure 3A:
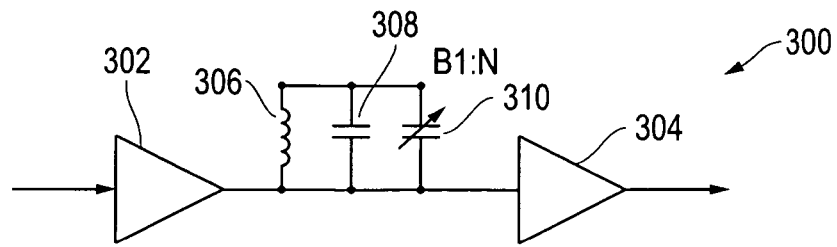
FIG. 3A is a block diagram of a single-ended embodiment for tunable gain stages for a narrow band tunable PA.

FIG. 3A is a block diagram of a single-ended embodiment 300 for tunable gain stages for a narrow band tunable PA. A first gain stage 302 receives an input signal representing the transmit signal to be output by the communication device. The first gain stage 302 provides a signal to a second gain stage 304, which in turn provides an output signal that is provided to further gain stages within the PA or that is provided as the output for the PA. The inductor 306, capacitor 308 and variable capacitor 310 provide a resonant structure that tunes the gain response for the single-ended embodiment 300. The variable capacitor 310 receives controls signals that allow for one of a plurality of bands (B1, B2 . . . BN) to be selected as represented by the designation B1:N.

Figure 3B:
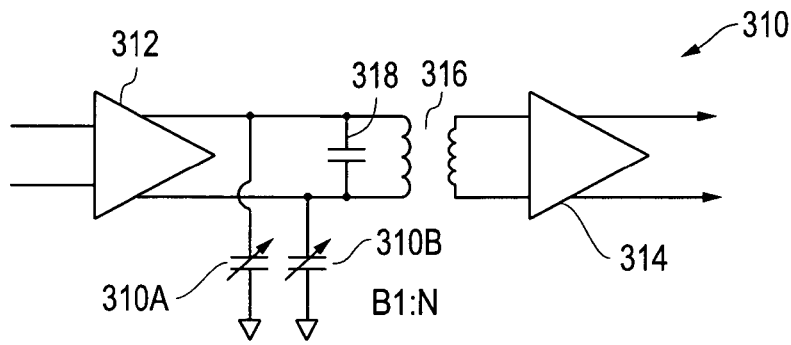
FIG. 3B is a block diagram of a differential embodiment for tunable gain stages for a narrow band tunable PA.

FIG. 3B is a block diagram of a differential embodiment 310 for tunable gain stages for a narrow band tunable PA. A first gain stage 312 receives a differential input signal representing the transmit signal to be output by the communication device. The first gain stage 312 provides a differential signal to a second gain stage 314, which in turn provides a differential output signal that is provided to further gain stages within the PA or that is provided as the output for the PA. The transformer 316, capacitor 318 and variable capacitors 310A and 310B provide a resonant structure that tunes the gain response for the differential embodiment 310. The variable capacitors 310A and 310B receive controls signals that allow for one of a plurality of bands (B1, B2 . . . BN) to be selected as represented by the designation B1:N.

Figure 3C:
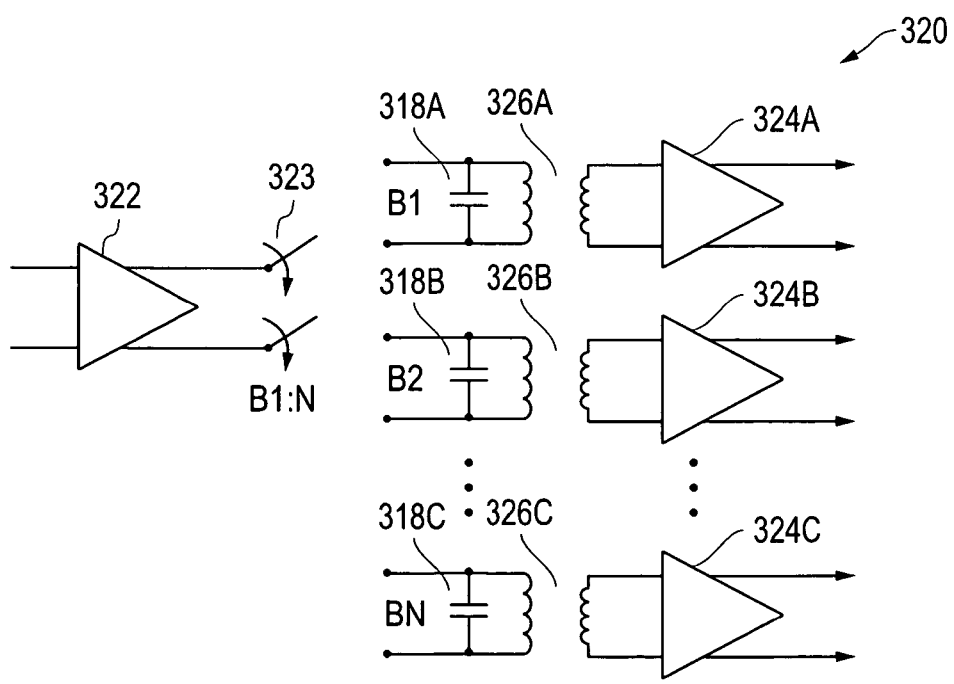
FIG. 3C is an alternative block diagram of a differential embodiment for tunable gain stages for a narrow band tunable PA.

FIG. 3C is an alternative block diagram of a differential embodiment 320 for tunable gain stages for a narrow band tunable PA. A first gain stage 322 receives a differential input signal representing the transmit signal to be output by the communication device. The first gain stage 322 provides a differential signal to a switch 323 that is used to select one of a plurality of different second gain stages 324A, 324B . . . 324C, which in turn provide differential output signals that are provided to further gain stages within the PA or that are provided as the output for the PA. Each of the second gain stages 324A, 324B . . . 324C are associated with one or more different desired frequency bands B1, B2 . . . BN. If the first frequency band (B1) is selected, the first gain stage 322A provides a differential signal to second gain stage 324A, and capacitor 318A and transformer 326A provide a resonant structure that tunes the gain response for the differential embodiment 320. If the second frequency band (B2) is selected, the first gain stage 322A provides a differential signal to second gain stage 324B, and capacitor 318B and transformer 326B provide a resonant structure that tunes the gain response for the differential embodiment 320. If the Nth frequency band (BN) is selected, the first gain stage 322A provides a differential signal to Nth gain stage 324N, and capacitor 318C and transformer 326C provide a resonant structure that tunes the gain response for the differential embodiment 320. The switch 323 receives controls signals that allow for one of a plurality of bands (B1, B2 . . . BN) to be selected as represented by the designation B1:N.

It is also noted that variations of the embodiments in FIGS. 3A, 3B and 3C could also be implemented, if desired, to provide a tunable gain response for a narrow band tunable PA.

Figure 3D:
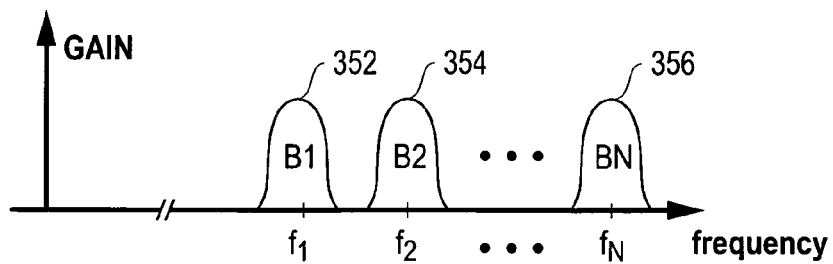
FIG. 3D is a diagram of example gain responses associated with the embodiments of FIGS. 3A-C.

FIG. 3D is a diagram of example gain responses associated with the embodiments of FIGS. 3A-C. A first gain response 352 having a first center frequency (f1) is provided for a first frequency band (B1). A second gain response 354 having a second center frequency (f2) is provided for a second frequency band (B2). And an Nth gain response 356 having an Nth center frequency (fN) is provided for an Nth frequency band (BN).

Figure 3E:
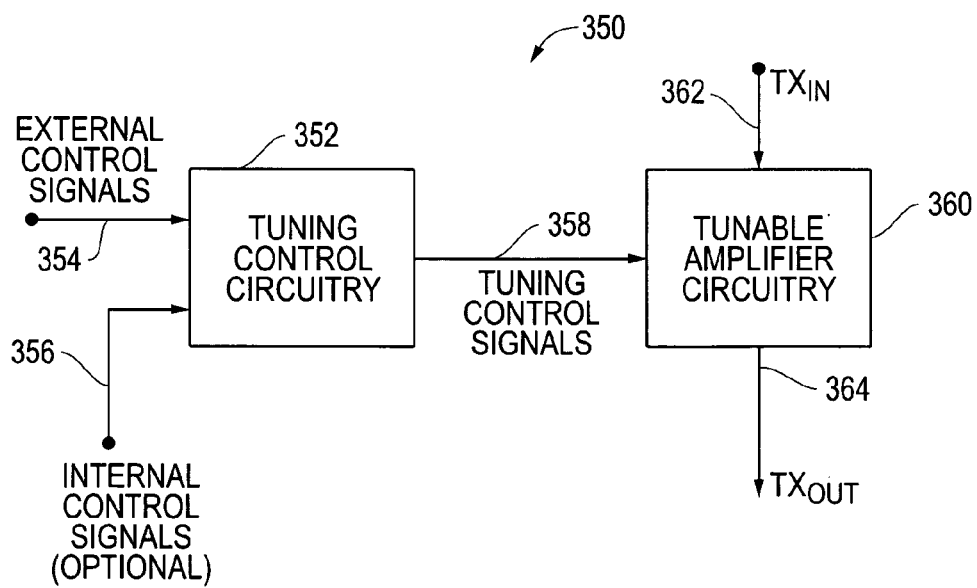
FIG. 3E is a block diagram of an embodiment for control circuitry configured to provide tuning control signals.

FIG. 3E is a block diagram of an embodiment 350 for control circuitry configured to provide tuning control signals. As depicted, tunable amplifier circuitry 360 for the PA receive an input transmit signal ($TX_{IN}$) 362 and produce an amplified transmit output signal ($TX_{OUT}$) 364. The tunable amplifier circuitry 360 also receive tuning control signals 358 that are used to tune the gain response for the tunable amplifier circuitry 360. The tuning control signals are provided by tuning control circuitry 352. The tuning control circuitry 352 can be controlled using external control signals 354 that can be provided through an external interface. The external interface can be any desired interface for providing band control signals to the PA. The tuning control circuitry 352 can also be controlled in part through one or more internal control signals 356, if desired. Further variations could also be provided while still utilizing the narrow band tunable PA techniques described herein.

Example embodiments for implementing variable capacitors that can be used within the tunable amplifier circuitry for narrow band tunable PAs are now discussed with respect to FIG. 4A. It is noted that these embodiments are provided as examples and should not be considered as limiting the invention. A wide variety of variable capacitor implementations and/or tunable amplifier circuitry could be utilized, as desired, to implement the narrow band tunable PAs described herein.

FIG. 4A is a circuit diagram of an embodiment 400 for a variable capacitor implementation for lower voltage signals. As depicted, the variable capacitor includes a plurality of capacitors (C0, C1, C2 . . . CN) that are coupled in parallel between a signal line 402 and a signal line 404, such as ground. These capacitors (C0, C1, C2 . . . CN) can be selectably included or excluded from the overall variable capacitance 406 through transistor switches that are controlled by digital control signals (D0, D1, D2 . . . DN). In particular, a capacitor C0 is coupled to signal line 402 and to ground 404 through a transistor switch that is controlled by signal D0. A capacitor C1 is coupled between a signal line 402 and ground 404 through a transistor switch that is controlled by signal D1. A capacitor C2 is coupled between a signal line 402 and ground 404 through a transistor switch that is controlled by signal D2. This continues until finally a capacitor CN is coupled between a signal line 402 and ground 404 through a transistor switch that is controlled by signal DN. The overall capacitance 406 is therefore controlled by the digital control signals 408 as represented by D1:N. Further, resistors (R0, R1, R2 . . . RN) can be coupled between a voltage bias ($V_{BIAS}$) and the nodes between the capacitors (C0, C1, C2 . . . CN) and the transistor switches in order to provide a bias to the floating capacitor nodes when the transistor switches are turned off by digital control signals (D0, D1, D2 . . . DN). It is further noted that additional switches could also be provided between the resistors (R0, R1, R2 . . . RN) and the voltage bias ($B_{BIAS}$) or between the resistors (R0, R1, R2 . . . RN) and the floating capacitor nodes, if desired, so that the resistors (R0, R1, R2 . . . RN) are only switched into the circuit to provide a bias voltage to the floating capacitor nodes when the transistor switches are turned off.

FIG. 4B is a circuit block diagram of an embodiment 470 for a narrow band tunable PA architecture including multiple gain stages and multiple variable capacitors. As depicted, the tunable PA embodiment 470 includes three gain stages: a first pre-amplifier (PRE-AMP) gain stage 472, a second driver (DRIVER) gain stage 474 and a third output (OUTPUT) gain stage 476. The embodiment 470 receives an input transmit signal ($TX_{IN}$) 478 and provides an amplified transmit output signal ($TX_{OUT}$) 480 to a load, which is represented by resistor ($R_L$) 492. Possible locations for a plurality of variable capacitors are depicted with respect to variable capacitors 483, 486, 488 and 489. These variable capacitors can be used to modify the resonance of a resonant structure formed in combination with transformers 482 and 490 and/or inductors 484, 485 and 487. With respect to the embodiments described above, the embodiment 400 of FIG. 4A could be utilized for variable capacitor 483, 486, 488 and 489. It is again noted that one or more of the variable capacitors could be utilized to provide the tunable gain response desired for the narrow band tunable PA. Further, if multiple variable capacitors are utilized, multiple different control signals can be utilized to control the different variable capacitor circuits, if desired.

FIG. 5 provides a flow diagram of an embodiment 500 for a process flow for adjusting the gain response for a narrow band tunable PA as described herein. In block 502, a desired frequency band of operation is selected for the communication device and the narrow band tunable PA. In block 504, tuning control signals are provided for the tunable PA based upon the desired frequency band of operation. In block 506, the gain response of the narrow band tunable PA is adjusted by circuitry within the tunable PA. And in block 508, the narrow band tunable PA is operated in the selected band to amplify transmit signals for the selected frequency band of operation. It is noted that a wide variety of different or additional processes could be implemented while still taking advantage of then narrow band tunable PAs described herein.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. A narrow band tunable radio frequency (RF) power amplifier, comprising:
   amplifier circuitry configured to receive a radio frequency (RF) signal and to generate an amplified RF output signal, the amplifier circuitry configured to provide a narrow band gain response tunable across a plurality of different frequency bands based upon one or more tuning control signals, and the narrow band gain response being linear across the different frequency bands; and
   control circuitry configured to provide the one or more tuning control signals to the amplifier circuitry based upon a frequency band selection signal;
   wherein each of the plurality of different frequency bands are associated with a different communication system;
   wherein the narrow band gain response is configured to pass frequencies within a selected frequency band and to reject frequencies outside the selected frequency band; and
   wherein the amplifier circuitry and the control circuitry are integrated on the same integrated circuit.

2. The narrow band tunable RF power amplifier of claim 1, wherein the amplifier circuitry and the control circuitry are fabricated using CMOS processing.

3. The narrow band tunable RF power amplifier of claim 1, wherein the amplifier circuitry comprises one or more amplifier stages and one or more tunable resonant structures associated with the one or more amplifier stages, each tunable resonant structure being configured to receive the one or more tuning control signals to adjust the narrow band gain response for the amplifier circuitry.

4. The narrow band tunable RF power amplifier of claim 3, wherein the one or more tunable resonant structures comprise one or more variable capacitors.

5. The narrow band tunable RF power amplifier of claim 3, wherein a center frequency for the narrow band gain response is adjustable.

6. The narrow band tunable RF power amplifier of claim 5, wherein a bandwidth for the narrow band gain response is adjustable.

7. The narrow band tunable RF power amplifier of claim 1, wherein the plurality of frequency bands are above 600 MHz.

8. The narrow band tunable RF power amplifier of claim 1, wherein the amplifier circuitry comprises single-ended input signals and output signals.

9. The narrow band tunable RF power amplifier of claim 1, wherein the amplifier circuitry comprises differential input signals and output signals.

10. The narrow band tunable RF power amplifier of claim 1, further comprising:
    a transmit input pin coupled to the amplifier circuitry and configured to receive the RF signal;
    a transmit output pin coupled to the amplifier circuitry and configured to output the amplified RF signal; and
    at least one band selection input pin coupled to the control circuitry and configured to receive a band selection signal.

11. The narrow band tunable RF power amplifier of claim 10, wherein the band selection signal comprises a signal configured to be provided to an antenna switch module for a communication device.

12. The narrow band tunable RF power amplifier of claim 1, further comprising:
    a transmit input pin coupled to the amplifier circuitry and configured to receive the RF signal;
    a transmit output pin coupled to the amplifier circuitry and configured to output the amplified RF signal; and
    at least one control input pin coupled to the control circuitry and configured to receive control signals, the control signals being configured to provide band selection.

13. The narrow band tunable RF power amplifier of claim 1, further comprising one or more internal control signals coupled to the control circuitry to adjust the narrow band gain response.

14. A method for operating a narrow band tunable radio frequency (RF) power amplifier, comprising:
    selecting a frequency band of operation for a narrow band tunable RF power amplifier from a plurality of different frequency bands, each of the plurality of different frequency bands being associated with a different communication system;
    tuning the narrow band tunable RF power amplifier to have a narrow band gain response for the selected frequency band, the narrow band gain response being configured to pass frequencies within a selected frequency band and to reject frequencies outside the selected frequency band;
    receiving a radio frequency (RF) signal;
    amplifying the RF input signal using the tuned narrow band gain response, the narrow band gain response being linear across the selected frequency band; and
    outputting the amplified RF signal;
    wherein the selecting, tuning, receiving, amplifying and outputting steps are performed within a single integrated circuit.

15. The method of claim 14, wherein the selecting, tuning, receiving, amplifying and outputting steps are performed within a single CMOS integrated circuit.

16. The method of claim 14, wherein the tuning step comprises tuning one or more resonant structures associated with one or more amplifier stages to adjust the narrow band gain response.

17. The method of claim 16, wherein the tuning step further comprises tuning one or more variable capacitors within the one or more tunable resonant structures.

18. The method of claim 16, wherein the tuning step comprises tuning a center frequency for the narrow band gain response.

19. The method of claim 18, wherein the tuning step comprises tuning a bandwidth for the narrow band gain response.

20. The method of claim 14, wherein the plurality of frequency bands are above 600 MHz.

21. The method of claim 14, wherein the receiving step comprises receiving the RF signal through a transmit input pin, wherein the outputting step comprises outputting the amplified RF signal through a transmit output pin, and wherein selecting step comprises using a band selection signal received through at least one band selection input pin.

22. The method of claim 21, wherein the band selection signal comprises a signal configured to be provided to an antenna switch module for a communication device.

23. The method of claim 14, wherein the receiving step comprises receiving the RF signal through a transmit input pin, wherein the outputting step comprises outputting the amplified RF signal through a transmit output pin, and wherein selecting step comprises using control signals received through at least one control input pin.

24. The method of claim 14, wherein the tuning step further comprises using one or more internal control signals to adjust the narrow band gain response.

\* \* \* \* \*

UNITED STATES PATENT AND TRADEMARK OFFICE
CERTIFICATE OF CORRECTION

| | | |
|---|---|---|
| PATENT NO. | : 8,244,194 B2 | Page 1 of 1 |
| APPLICATION NO. | : 12/803884 | |
| DATED | : August 14, 2012 | |
| INVENTOR(S) | : Patrick Morgan et al. | |

It is certified that error appears in the above-identified patent and that said Letters Patent is hereby corrected as shown below:

In column 8, line 16, delete "0279609," and insert --0278609--.

In column 8, line 24, delete "Further,".

Signed and Sealed this
Fourth Day of December, 2012

David J. Kappos
*Director of the United States Patent and Trademark Office*